United States Patent
Shin et al.

(10) Patent No.: US 11,086,223 B2
(45) Date of Patent: Aug. 10, 2021

(54) HARDMASK COMPOSITION AND METHOD OF FORMING PATTERN USING THE HARDMASK COMPOSITION

(71) Applicant: Samsung Electronics Co., Ltd., Suwon-si (KR)

(72) Inventors: Hyeonjin Shin, Suwon-si (KR); Sangwon Kim, Seoul (KR); Minsu Seol, Seoul (KR); Seongjun Park, Seoul (KR); Yeonchoo Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 249 days.

(21) Appl. No.: 16/426,046

(22) Filed: May 30, 2019

(65) Prior Publication Data
US 2019/0294047 A1  Sep. 26, 2019

Related U.S. Application Data

(62) Division of application No. 14/843,003, filed on Sep. 2, 2015, now Pat. No. 10,495,972.

(30) Foreign Application Priority Data

Apr. 3, 2015 (KR) ..................... 10-2015-0047492

(51) Int. Cl.
*G03F 7/36* (2006.01)
*G03F 7/11* (2006.01)
*G03F 7/09* (2006.01)
*G03F 7/16* (2006.01)

(52) U.S. Cl.
CPC ............... *G03F 7/36* (2013.01); *G03F 7/094* (2013.01); *G03F 7/11* (2013.01); *G03F 7/16* (2013.01); *G03F 7/168* (2013.01)

(58) Field of Classification Search
CPC ... G03F 7/36; G03F 7/11; G03F 7/094; B81C 2201/0132
See application file for complete search history.

(56) References Cited

U.S. PATENT DOCUMENTS

| | | | |
|---|---|---|---|
| 4,550,015 A | 10/1985 | Korb et al. |
| 4,679,054 A | 7/1987 | Yoshikawa et al. |
| 5,328,560 A | 7/1994 | Hanawa et al. |
| 5,432,227 A | 7/1995 | Fujimura |
| 6,031,756 A | 2/2000 | Gimzewski et al. |

(Continued)

FOREIGN PATENT DOCUMENTS

| CN | 102774824 A | 11/2012 |
|---|---|---|
| CN | 102775786 A | 11/2012 |

(Continued)

OTHER PUBLICATIONS

Sung Ho Song et al., "Highly Efficient Light-Emitting Diode of Graphene Quantum Dots Fabricated from Graphite Intercalation Compounds", Advanced Optical Materials, 2014, pp. 8.

(Continued)

*Primary Examiner* — John S Chu
(74) *Attorney, Agent, or Firm* — Harness, Dickey & Pierce, P.L.C.

(57) ABSTRACT

A hardmask composition may include graphene nanoparticles having a size in a range of about 5 nm to about 100 nm and a solvent.

5 Claims, 5 Drawing Sheets

(56) References Cited

U.S. PATENT DOCUMENTS

| | | | |
|---|---|---|---|
| 6,120,858 | A | 9/2000 | Hirano et al. |
| 7,658,969 | B2 | 2/2010 | Kumar et al. |
| 7,803,715 | B1 | 9/2010 | Haimson et al. |
| 8,008,095 | B2 | 8/2011 | Assefa et al. |
| 8,071,485 | B2 | 12/2011 | Lee et al. |
| 8,258,346 | B2 | 9/2012 | Rajendran |
| 8,524,594 | B2 | 9/2013 | Horikoshi |
| 8,664,439 | B2 | 3/2014 | Lee et al. |
| 8,871,639 | B2 | 10/2014 | Chien et al. |
| 9,018,776 | B2 | 4/2015 | Song et al. |
| 9,562,169 | B2 | 2/2017 | Wang et al. |
| 9,583,358 | B2 | 2/2017 | Kim et al. |
| 9,666,602 | B2 | 5/2017 | Lee et al. |
| 2002/0051931 | A1 | 5/2002 | Mori et al. |
| 2003/0203314 | A1 | 10/2003 | Sebald et al. |
| 2005/0112383 | A1 | 5/2005 | Tanaka et al. |
| 2005/0250052 | A1 | 11/2005 | Nguyen |
| 2007/0026682 | A1 | 2/2007 | Hochberg et al. |
| 2007/0148557 | A1 | 6/2007 | Takei et al. |
| 2008/0032176 | A1 | 2/2008 | Shimizu et al. |
| 2009/0011204 | A1 | 1/2009 | Wang et al. |
| 2009/0140350 | A1 | 6/2009 | Zhu |
| 2009/0297784 | A1* | 12/2009 | Xu .................. G03F 7/11 428/172 |
| 2010/0055464 | A1 | 3/2010 | Sung |
| 2010/0086463 | A1 | 4/2010 | Rudhard et al. |
| 2010/0218801 | A1 | 9/2010 | Sung et al. |
| 2010/0316950 | A1 | 12/2010 | Oguro et al. |
| 2011/0014111 | A1 | 1/2011 | Leugers et al. |
| 2011/0210282 | A1 | 9/2011 | Foley |
| 2011/0244142 | A1 | 10/2011 | Cheng et al. |
| 2012/0153511 | A1 | 6/2012 | Song et al. |
| 2012/0181507 | A1 | 7/2012 | Dimitrakopoulos et al. |
| 2012/0193610 | A1 | 8/2012 | Kim |
| 2012/0245058 | A1 | 9/2012 | Monteiro et al. |
| 2013/0011630 | A1 | 1/2013 | Sullivan et al. |
| 2013/0105440 | A1 | 5/2013 | Lu et al. |
| 2013/0119350 | A1 | 5/2013 | Dimitrakopoulos et al. |
| 2013/0133925 | A1 | 5/2013 | Kim et al. |
| 2013/0203198 | A1 | 8/2013 | Min et al. |
| 2013/0236715 | A1 | 9/2013 | Zhamu et al. |
| 2013/0313523 | A1 | 11/2013 | Yun et al. |
| 2014/0015000 | A1 | 1/2014 | Nishiyama et al. |
| 2014/0098458 | A1 | 4/2014 | Almadhoun et al. |
| 2014/0183701 | A1 | 7/2014 | Choi et al. |
| 2014/0186777 | A1 | 7/2014 | Lee et al. |
| 2014/0187035 | A1 | 7/2014 | Posseme et al. |
| 2014/0239462 | A1 | 8/2014 | Shamma et al. |
| 2014/0299820 | A1 | 10/2014 | Harandek et al. |
| 2014/0299841 | A1 | 10/2014 | Nourbakhsh et al. |
| 2014/0320959 | A1 | 10/2014 | Jun et al. |
| 2014/0342273 | A1 | 11/2014 | Kim et al. |
| 2014/0346408 | A1 | 11/2014 | Yun et al. |
| 2015/0001178 | A1 | 1/2015 | Song et al. |
| 2015/0004531 | A1 | 1/2015 | Choi et al. |
| 2015/0008212 | A1 | 1/2015 | Choi et al. |
| 2015/0030968 | A1 | 1/2015 | Schwab et al. |
| 2015/0056394 | A1 | 2/2015 | Rawls |
| 2015/0064904 | A1 | 3/2015 | Yao et al. |
| 2015/0129809 | A1 | 5/2015 | Gauthy et al. |
| 2015/0137077 | A1 | 5/2015 | Yun et al. |
| 2015/0200090 | A1 | 7/2015 | Chada et al. |
| 2015/0200091 | A1 | 7/2015 | Chada et al. |
| 2015/0307730 | A1 | 10/2015 | Hersam et al. |
| 2015/0348794 | A1 | 12/2015 | Kim et al. |
| 2015/0376014 | A1 | 12/2015 | Cesareo et al. |
| 2015/0377824 | A1 | 12/2015 | Ruhl et al. |
| 2016/0005625 | A1 | 1/2016 | Shin et al. |
| 2016/0011511 | A1 | 1/2016 | Shin et al. |
| 2016/0027645 | A1 | 1/2016 | Shin et al. |
| 2016/0043384 | A1 | 2/2016 | Zhamu et al. |
| 2016/0130151 | A1 | 5/2016 | Kurungot et al. |
| 2016/0152748 | A1 | 6/2016 | Goffredi et al. |
| 2016/0179005 | A1 | 6/2016 | Shamma et al. |
| 2016/0211142 | A1 | 7/2016 | Kim et al. |
| 2016/0225991 | A1 | 8/2016 | Schwab et al. |
| 2016/0240841 | A1 | 8/2016 | He et al. |
| 2016/0282721 | A1 | 9/2016 | Seol et al. |
| 2016/0284811 | A1 | 9/2016 | Yu et al. |
| 2016/0291472 | A1 | 10/2016 | Shin et al. |
| 2016/0346769 | A1 | 12/2016 | Kim et al. |
| 2016/0369149 | A1 | 12/2016 | Liu et al. |
| 2017/0040178 | A1 | 2/2017 | Kim et al. |
| 2019/0019675 | A1* | 1/2019 | Lee .................. H01B 1/04 |

FOREIGN PATENT DOCUMENTS

| | | |
|---|---|---|
| EP | 1703328 A1 | 9/2006 |
| EP | 2950334 A1 | 12/2015 |
| JP | 52059792 | 5/1977 |
| JP | 05163021 | 12/1991 |
| JP | H 5-343308 A | 12/1993 |
| JP | 3396846 B2 | 4/2003 |
| JP | 2005-173552 A | 6/2005 |
| JP | 4488234 B2 | 6/2010 |
| JP | 4531400 B2 | 8/2010 |
| JP | 2013-185155 A | 9/2013 |
| JP | 2013-208881 A | 10/2013 |
| KR | 10257694 B1 | 1/2011 |
| KR | 10-1057218 B1 | 8/2011 |
| KR | 20110138611 A | 12/2011 |
| KR | 10-2012-0024756 A | 3/2012 |
| KR | 101114131 B1 | 3/2012 |
| KR | 20120077466 A | 7/2012 |
| KR | 20130062924 A | 6/2013 |
| KR | 10-2013-0132103 A | 12/2013 |
| KR | 10-1343014 B1 | 12/2013 |
| KR | 2014-0066524 A | 6/2014 |
| KR | 10-1423171 B1 | 7/2014 |
| KR | 1439030 B1 | 9/2014 |
| KR | 2016-0118782 A | 10/2016 |
| WO | WO-2012/129302 A2 | 9/2012 |
| WO | WO-2013/100365 A1 | 7/2013 |
| WO | WO-2014/135455 A1 | 9/2014 |

OTHER PUBLICATIONS

Liang Wang et al., "Gram-scale synthesis of single-crystalline graphene quantum dots with superior optical properties", Macmillan Publishers Limited, 2014, pp. 9.

Yonghun Shin et al., "Mass Production of Graphene Quantun Dots by One-Pot Synthesis Directly from Graphite in High Yield", small-journal.com, 2014, 10, No. 5, pp. 866-870.

Zhang, et al. "Fabrication of highly oriented reduced graphene oxide microbelts array for massive production of sensitive ammonia gas sensor," Journal of Micromechanics and Microengineering, vol. 23, pp. 1-8 (2013).

Hwang, et al. "Transparent actuator made with few layer graphene electrode and dielectric elastomer, for variable focus lens," Applied Physics Letters, vol. 103, pp. 023106-1-023106-5 (2013).

Huang, et al. "An innovative way of etching MoS2: Characterization and mechanistic investigation," Nano Research, vol. 6, No. 3, pp. 200-207 (2013).

Extended European Search Report dated Aug. 17, 2016 issued in corresponding European Application No. 15193939.4.

U.S. Office Action dated May 2, 2017 issued in co-pending U.S. Appl. No. 14/825,792.

U.S. Office Action dated Sep. 14, 2017 issued in co-pending U.S. Appl. No. 14/825,792.

Shin, et al. "Mass Production of Graphene Quantum Dots by One-Pot Synthesis Directly from Graphite in High Yield," Samll-journal.com, vol. 10, No. 5, pp. 866-870 (2014).

Wang et al., "Gram-scale synthesis of single-crystalline graphene quantum dots with superior optical properties," Macmillian Publishers Limited, pp. 1-9 (2014).

Song, et al. "Highly Efficient Light-Emitting Diode of Graphene Quantum Dots Fabricated from Graphite Intercalation Compounds," Advanced Optical Materials, pp. 1-8 (2014).

U.S. Notice of Allowance dated Aug. 28, 2017 issued in co-pending U.S. Appl. No. 14/791,912.

(56) References Cited

OTHER PUBLICATIONS

U.S. Office Action dated Mar. 22, 2016 issued in co-pending U.S. Appl. No. 14/725,390.
U.S. Office Action dated Jun. 13, 2017, issued in co-pending U.S. Appl. No. 14/791,912.
U.S. Notice of Allowance dated Mar. 15, 2017, issued in co-pending U.S. Appl. No. 14/697,150.
U.S. Office Action dated Feb. 8, 2017 issued in co-pending U.S. Appl. No. 14/791,912.
"Silane Coupling Agents," Xiameter for Dow Corning, Silicones Simplified, pp. 1-7 (2009).
U.S. Office Action dated May 10, 2016 issued in co-pending U.S. Appl. No. 14/791,912.
U.S. Office Action dated Aug. 16, 2016 issued in co-pending U.S. Appl. No. 14/791,912.
U.S. Office Action dated Mar. 28, 2016 issued in co-pending U.S. Appl. No. 14/967,150.
U.S. Office Action dated Sep. 30, 2016 issued in co-pending U.S. Appl. No. 14/967,150.
U.S. Notice of Allowance dated Oct. 19, 2016 issued in co-pending U.S. Appl. No. 14/725,390.
Grenadier, et al. "Dry etching techniques for active devices based on hexagonal boron nitride epilayers," Journal of Vacuum Science & Technology A, vol. 31, pp. 061517-061517.3 (2013).
S. Hascik, et al. "Dry etching of carbon layers in various etch gases," Vacuum, vol. 58, pp. 434-439 (2000).
Albert S. Nazarov, et al. "Functionalization and dispersion of h-BN nanosheets treated with inorganic reagents," Chemistry, An Asian Journal, vol. 7, Issue 3, pp. 1-6 (2012).
European Search Report dated Sep. 30, 2015 issued in corresponding European Application No. 15169702.6.
U.S. Office Action dated Dec. 5, 2017 issued in co-pending U.S. Appl. No. 15/611,935.
U.S. Office Action dated Feb. 22, 2018, in related U.S. Appl. No. 14/25,792.
U.S. Office Action dated Feb. 21, 2018 in U.S. Appl. No. 15/332,287.
U.S. Notice of Allowance dated Mar. 27, 2018, issued in co-pending U.S. Appl. No. 15/611,935.
U.S. Notice of Allowance dated Jul. 16, 2018 issued in copending U.S. Appl. No. 14/825,792.
U.S. Notice of Allowance dated Jul. 20, 2018 issued in copending U.S. Appl. No. 15/611,935.
Office Action issued for co-pending U.S. Appl. No. 14/791,912 dated Aug. 10, 2018.
Notice of Allowance issued for co-pending U.S. Appl. No. 15/332,287, dated Aug. 29, 2018.
Examination Report issued by the European Patent Office for EP Appl. No. 15 193 939.4 dated Oct. 29, 2018.
Notice of Allowance and Fees Due dated Jan. 30, 2019 for U.S. Appl. No. 14/791,912.
Prolongo et al., "Graphene nanoplatelets thickness and lateral size influence on the morphology and behavior of epoxy composites" Apr. 2014, European Polymer Journal. vol. 53, pp. 292-301 (2014).
Applicant intiated Interview Summary for U.S. Appl. No. 14/791,912, dated Oct. 17, 2016.

\* cited by examiner

US 11,086,223 B2

HARDMASK COMPOSITION AND METHOD OF FORMING PATTERN USING THE HARDMASK COMPOSITION

CROSS-REFERENCE TO RELATED APPLICATION

This application is a divisional of U.S. application Ser. No. 14/843,003, filed on Sep. 2, 2015, which claims the benefit of Korean Patent Application No. 10-2015-0047492, filed on Apr. 3, 2015, in the Korean Intellectual Property Office, the disclosure of each which is incorporated herein in its entirety by reference.

BACKGROUND

1. Field

Example embodiments relate to a hardmask composition and a method of forming a pattern using the hardmask composition.

2. Description of the Related Art

The semiconductor industry has developed an ultra-fine technique for providing a pattern having a size of several to several tens of nanometers. Such an ultrafine technique benefits from effective lithographic techniques. A typical lithographic technique includes providing a material layer on a semiconductor substrate, coating a photoresist layer on the material layer, exposing and developing the same to provide a photoresist pattern, and etching the material layer using the photoresist pattern as a mask.

In order to minimize or reduce the pattern to be formed, providing a fine pattern having a desirable profile by only the typical lithographic technique described above may be difficult. Accordingly, a layer, called "a hardmask", may be formed between the material layer for etching and the photoresist layer to provide a fine pattern. The hardmask serves as an interlayer that transfers the fine pattern of the photoresist to the material layer through a selective etching process. Thus, the hardmask layer needs to have chemical resistance, thermal resistance, and etching resistance in order to tolerate various types of etching processes.

As semiconductor devices have become highly integrated, a height of a material layer is maintained the same or has increased, although a line-width of the material layer has gradually narrowed. Thus, an aspect ratio of the material layer has increased. Because an etching process needs to be performed under such conditions, the heights of a photoresist layer and a hardmask pattern also need to be increased. However, increasing the heights of a photoresist layer and a hardmask pattern is limited. In addition, the hardmask pattern may be damaged during the etching process for obtaining a material layer with a narrow line-width, and thus electrical characteristics of the devices may deteriorate.

In this regard, methods have been suggested to use a single layer or multiple layers, in which a plurality of layers are stacked, of a conductive or insulative material, e.g., a polysilicon layer, a tungsten layer, and a nitride layer. However, the single layer or the multiple layers requires a relatively high deposition temperature, and thus physical properties of the material layer may be modified.

SUMMARY

Example embodiments provide a hardmask composition with improved etching resistance.

Example embodiments also provide a method of forming a pattern using the hardmask composition.

Additional aspects will be set forth in part in the description which follows and, in part, will be apparent from the description, or may be learned by practice of the presented example embodiments.

According to example embodiments, a hardmask composition includes a plurality of graphene nanoparticles having a size in a range of about 5 nm to about 100 nm, and a solvent.

According to example embodiments, a method of forming a pattern includes forming an etching layer on a substrate, forming a hardmask layer including graphene nanoparticles by providing a hardmask composition on the etching layer, the hardmask composition including a plurality of graphene nanoparticles having a size in a range of about 5 nm to about 100 nm, and a solvent, forming a photoresist layer on the hardmask layer, forming a hardmask including the plurality of graphene nanoparticles by patterning the hardmask layer, the patterning including etching the plurality of graphene nanoparticles using the photoresist layer as an etching mask, and etching the etching layer using the hardmask as an etching mask.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1A:
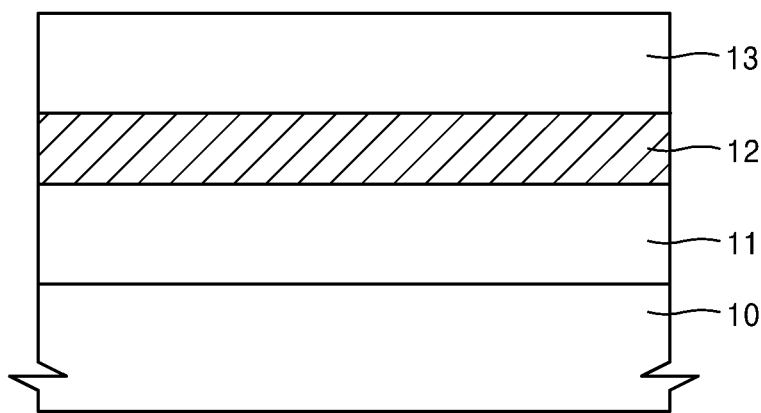
FIGS. 1A to 1E illustrate a method of forming a pattern using a hardmask composition according to example embodiments.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "includes", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a hardmask composition according to example embodiments and a method of forming a pattern using the hardmask composition will be described in detail.

A hardmask composition includes a graphene nanoparticle having a size ranging from about 5 nm to about 100 nm and a solvent.

The graphene nanoparticle may have a 2-dimensional plate-like shape or a spherical shape. The graphene nanoparticle may have a spherical shape. Here, the term "spherical" denotes all types of shape that is substantially close to a sphere. For example, the spherical shape may be a spherical shape or an oval shape.

When the graphene nanoparticle has a spherical shape, the term "size" denotes an average particle diameter of the graphene nanoparticle. When the graphene nanoparticle has a plate-like shape, the term "size" denotes a diameter of the 2-dimensional flat shape. When the graphene nanoparticle may have an oval shape, the term "size" may denote a major axis diameter. A size of the graphene nanoparticle may be in a range of about 5 nm to about 100 nm, or, for example, about 5 nm to about 50 nm, or about 5 nm to about 30 nm. Also, the number of layers of the graphene nanoparticle may be 300 or less, or, for example, 100 or less, or, in a range of about 1 to about 20. Also, a thickness of the graphene nanoparticle is about 100 nm.

When a size, the number of layers, and a thickness of the graphene nanoparticle is within these ranges about, the hardmask composition may have improved stability.

The graphene nanoparticle contains an edge carbon (edge C) existing at an edge site and a center carbon (center C) existing at a center site. The edge carbon has a $sp^3$ binding structure, and the center carbon has a $sp^2$ binding structure. A functional group (e.g., oxygen or nitrogen) may be bonded to the edge carbon, and thus reactivity of the edge carbon with respect to an etching solution is greater than that of the center carbon.

In the graphene nanoparticle, an amount of the edge carbon may be about 20 atom % or less, or, for example, in a range of about 1.2 atom % to about 19.1 atom %.

In the graphene nanoparticle, an amount of the edge carbon and the center carbon may be calculated using a carbon-carbon bond length in the graphene nanoparticle.

When a size of the graphene nanoparticle is 5 nm or less, an amount of the edge carbon is greater than 20 atom % based on the total amount of carbon of the graphene nanoparticle, and thus an etching rate of a hardmask formed using the hardmask composition may be too high. Also, when a size of the graphene nanoparticle is greater than 100 nm, an etching rate of the hardmask may be appropriately controlled, but dispersibility of the graphene nanoparticle in the hardmask composition may deteriorate.

Amounts of the edge carbon when a size of the graphene nanoparticle is in and out of a range of about 5 nm to about 100 nm are shown in Table 1.

TABLE 1

| Size of graphene nanoparticle (nm) | Amount of edge carbon (atom %) |
|---|---|
| 0.9 | 76.0 |
| 2.0 | 44.1 |
| 3.2 | 30.7 |
| 4.9 | 21.1 |
| 5.5 | 19.1 |
| 7.3 | 14.8 |
| 10.2 | 10.8 |
| 15.4 | 7.3 |
| 20.0 | 5.6 |
| 25.2 | 4.5 |
| 29.9 | 3.8 |
| 40.3 | 2.8 |
| 50.2 | 2.3 |
| 60.0 | 1.9 |
| 80.3 | 1.4 |
| 100.0 | 1.2 |

An amount of oxygen contained in the graphene nanoparticle may be in a range of about 0.01 atom % to about 40 atom %.

An amount of oxygen may be in a range of about 6.5 atom % to about 19.9 atom %, or, for example, about 10.33 atom % to about 14.28 atom %. The amount of oxygen may be measured using, for example, an XPS analysis.

When the amount of oxygen is within this range, degassing may not occur during an etching process of the hardmask formed using the hardmask composition, and the hardmask may have desirable etching resistance.

When the amount of oxygen of the graphene nanoparticle is within this range, the graphene nanoparticle has hydrophilic property, and thus an adhesive strength of the graphene nanoparticle to another layer may improve. Also, solvent dispersibility of the graphene nanoparticle improves, and thus a hardmask composition may be more easily manufactured. In addition, etching resistance with respect to an etching gas may improve due to a high bond dissociation energy of the functional group including an oxygen atom.

Each of D50, D90, and D10 of the graphene nanoparticles denotes a particle size when the graphene nanoparticles are accumulated at a volume ratio of 50%, 90%, or 10%. Here, a particle size may refer to an average particle diameter when the graphene nanoparticles have a spherical shape, or a longitudinal length when the graphene nanoparticles do not have a spherical shape (e.g., have an oval or a rectangular shape).

In the hardmask, light scattering does not occur in a range of visible light, and a transmittance of the hardmask at a wavelength of about 633 nm is about 1% or lower. In this regard, when a hardmasks with improved transmittance is used, sensing of a hardmask pattern and an align mask for patterning an etching layer becomes easier, and thus the to-be-etched layer may be patterned at a finer and more compact pattern size.

The graphene nanoparticles contained in the hardmask may have k that is 0.5 or lower, or, for example, about 0.3 or lower, or 0.1 or lower, at a wavelength of about 633 nm. For comparison, k of graphite is in a range of about 1.3 to about 1.5, and k of graphene, which is only formed of a $sp^2$ bond structure, is in a range of about 1.1 to about 1.3.

k is an extinction coefficient which is measured using a spectroscopic ellipsometer. When k of the graphene nanoparticles is within the range above and a hardmasks formed using the graphene nanoparticles is used, an align mark may be more easily sensed.

Graphene includes polycyclic aromatic molecules that are formed when a plurality of carbon atoms are linked by covalent bond, and the carbon atoms linked by covalent bond may form a 6-membered ring as a repeating unit, or may further include a 5-membered ring and/or a 7-membered ring. As a result, graphene may appear as a single layer of the covalent bonded carbon atoms (generally $sp^2$ bond). Graphene may be formed of a single layer, but a plurality of layers may be stacked and form multiple layers, in which the number of layers may be 300 or less, or, for example, in a range of 1 to 100, or 3 to 50.

The total thickness of the graphene nanoparticle may be, for example, in a range of about 0.34 nm to about 100 nm. The graphene nanoparticles having the thickness has a stable structure.

A graphene nanoparticle according to example embodiments includes some oxygen atoms in addition to carbon atoms rather than having a complete C=C/C—C conjugated structure. Also, a carboxyl group, a hydroxyl group, an epoxy group, or a carbonyl group may be present at an end of a 2-dimensional carbon nanostructure in the graphene nanoparticle.

The graphene nanoparticles have improved solvent dispersibility, and thus manufacture of a hardmask composition with improved stability is convenient. Also, the graphene nanoparticles improve etching resistance against an etching gas.

At least one functional group selected from the group consisting of a hydroxyl group, an epoxy group, a carboxyl group, a carbonyl group, an amine group, and an amide group may be bonded at an end of the graphene nanoparticle, In this regard, when the functional group is bonded at the end of the graphene nanoparticle, etching resistance of a hardmask formed using the hardmask composition may be better than that of the case when the functional group is present in the center of the graphene nanoparticle as well as at the end of the graphene nanoparticle.

An amount of the graphene nanoparticles is in a range of about 0.1 wt % to about 40 wt %. When the amount of the graphene is within this range, stability and etching resistance of the graphene nanoparticle improve.

The graphene nanoparticle according to example embodiments may have peaks observed at about 1340 $cm^{-1}$ to about 1350 $cm^{-1}$, about 1580 cm-1, and about 2700 $cm^{-1}$ in Raman spectrum analysis. The peaks provide information of a thickness, a crystallinity, and a charge doping status of the graphene nanoparticle. The peak observed at about 1580 $cm^{-1}$ is a "G mode" peak, which is generated by a vibration mode corresponding to stretching of a carbon-carbon bond, and energy of the "G mode" is determined by a density of excess charge doped in the graphene nanoparticle. Also, the peak observed at about 2700 cm-1 is a "2D mode" peak that is useful in the evaluation of a thickness of the graphene nanoparticle. The peak observed at about 1340 $cm^{-1}$ to about 1350 cm-1 is a "D mode" peak, which appears when an $sp^2$ crystal structure has defects and is mainly observed when many defects are found around edges of a sample or in the sample itself. Also, a ratio of a D peak intensity to a G peak intensity (an D/G intensity ratio) provides information of a degree of disorder of crystals of the graphene nanoparticle.

An intensity ratio (ID/IG) of a D mode peak to a G mode peak obtained from Raman spectroscopy analysis of the graphene nanoparticles is 2 or lower, or, for example, in a range of about 0.001 to about 2.0.

An intensity ratio (I2D/IG) of a 2D mode peak to a G mode peak obtained from Raman spectroscopy analysis of the graphene nanoparticles is 0.01 or higher. For example, the intensity ratio (I2D/IG) is within a range of about 0.01 to about 1.0, or about 0.05 to about 0.5.

When the intensity ratio of a D mode peak to a G mode peak and the intensity ratio of a 2D mode peak to a G mode peak are within the ranges above, the graphene nanoparticle may have a relatively high crystallinity and a relatively small defect, and thus a bonding energy increases so that a hardmask prepared using the graphene nanoparticle may have desirable etching resistance.

X-ray diffraction analysis using CuKα is performed on the graphene nanoparticle, and as the result of the X-ray analysis, the graphene nanoparticle may include a 2-dimensional layered structure having a (002) crystal face peak. The (002) crystal face peak is observed within a range of about 20° to about 27°.

A d-spacing of the graphene nanoparticle obtained from the X-ray diffraction analysis is in a range of about 0.3 nm to about 0.7 nm, for example, about 0.334 to about 0.478 nm. When the d-spacing is within is range, the hardmask composition may have desirable etching resistance.

The graphene nanoparticle is formed as a single layer of 2-dimensional nanocrystalline carbon or it is formed by stacking multiple layers of 2-dimensional nanocrystalline carbon.

The graphene nanoparticle according to example embodiments has a higher content of $sp^2$ carbon than that of $sp^3$ carbon and a high content of oxygen compared to a conventional amorphous carbon layer. An sp² carbon bond (that is, a bond of an aromatic structure) has a higher bonding energy than that of an sp³ carbon bond.

The sp³ structure is a 3-dimensional bonding structure of diamond having a tetrahedral shape, and the sp² structure is a 2-dimensional bonding structure of graphite in which a carbon to hydrogen ratio (a C/H ratio) increases and thus may secure resistance to dry etching.

In the graphene nanoparticle, an sp² carbon fraction is equal to or a multiple of an sp³ carbon fraction. For example, an sp² carbon fraction is a multiple of an sp³ carbon fraction by about 1.0 to about 10, or by about 1.88 to 3.42.

An amount of the sp² carbon atom bonding structure is about 30 atom % or more, for example, about 39.7 atom % to about 62.5 atom %, in the C1s XPS analysis. Due to the mixing ratio, bond breakage of the graphene nanoparticle may be difficult because carbon-carbon bond energy is relatively high. Thus, when a hardmask composition including the graphene nanoparticle is used, etching resistance characteristics during the etching process may improve. Also, a bond strength between the hardmask and adjacent layers may increase.

A hardmask obtained using conventional amorphous carbon mainly includes a sp²-centered carbon atom binding structure and thus may have desirable etching resistance and relatively low transparency. Therefore, when the hardmasks are aligned, problems may occur, and particles may be generated during a deposition process, and thus a hardmasks manufactured using a diamond-like carbon having a sp³-carbon atom binding structure has been developed. However, the hardmask has relatively low etching resistance and thus has a limit in process application.

A k value of graphite is in a range of about 1.3 to about 1.5, and a k value of graphene having a sp² structure is in a range of about 1.1 to about 1.3. The graphene nanoparticle according to example embodiments has a k value that is 1.0 or lower at a predetermined or given wavelength, or, for example, in a range of about 0.1 to about 0.5 and thus has improved transparency. Thus, when a hardmask including the graphene nanoparticle is used, an align mark may be more easily sensed during formation of a pattern of an etching layer. Therefore, the pattern may be more finely and evenly formed, and the hardmask may have desirable etching resistance.

In the hardmask composition according to example embodiments, any solvent capable of dispersing the graphene nanoparticle may be used. For example, the solvent may be at least one selected from water, an alcohol-based solvent, and an organic solvent.

Examples of the alcohol-based solvent may include methanol, ethanol, and isopropanol, and examples of the organic solvent may include N,N-dimethylformamide, N-methylpyrrolidone, dichloroethane, dichlorobenzene, N,N-dimethylsulfoxide, xylene, aniline, propylene glycol, propylene glycol diacetate, methoxypropanediol, diethyleneglycol, gamma-butyrolactone, acetylacetone, cyclohexanone, propylene glycol monomethyl ether acetate, γ-butyrolactone, dichloroethane, O-dichlorobenzene, nitromethane, tetrahydrofuran, nitromethane, dimethyl sulfoxide, nitrobenzene, butyl nitrite, methylcellosolve, ethylcellosolve, diethylether, diethyleneglycolmethylether, diethyleneglycolethylether, dipropyleneglycolmethylether, toluene, hexane, methylethylketone, methylisoketone, hydroxymethylcellulose, and heptanes.

An amount of the solvent may be about 100 parts to about 100,000 parts by weight based on 100 parts by weight of the total weight of the graphene nanoparticle. When the amount of the solvent is within this range, the hardmask composition may have an appropriate viscosity and thus may more easily form a layer.

The hardmask composition may further include a first material that is selected from an aromatic ring-containing monomer and a polymer containing a repeating unit including an aromatic ring-containing monomer; a second material that is at least one selected from the group consisting of a hexagonal boron nitride, a chalcogenide-based material, and their precursors; or a mixture thereof.

The first material may not be combined with the second material, or the first material may be combined to the second material by a chemical bond. In this regard, the first material and the second material combined by a chemical bond form a composite structure. The first material and the second material having the functional groups above may be linked to each other through a chemical bond.

The chemical bond may be, for example, a covalent bond. Here, the covalent bond may include at least one selected from an ester group (—C(=O)O—), an ether group (—O—), a thioether group (—S—), a carbonyl group ((—C)=O)—), and an amide group (—C(=O)NH—).

The first material and the second material may include at least one selected from the group consisting of a hydroxyl group, a carboxyl group, an amino group, —Si($R_1$)($R_2$)($R_3$) (where, each of $R_1$, $R_2$, and $R_3$ are independently one of a hydrogen, a hydroxyl group, a $C_1$-$C_{30}$ alkyl group, a $C_1$-$C_{30}$ alkoxy group, a $C_6$-$C_{30}$ aryl group, a $C_6$-$C_{30}$ aryloxy group, or a halogen atom), a thiol group (—SH), —Cl, —C(=O)Cl, —$SCH_3$, a glycidyloxy group, a halogen atom, an isocyanate group, a glycidyloxy group, an aldehyde group, an epoxy group, an imino group, an urethane group, an ester group, an amide group, an imide group, an acryl group, a methacryl group, —$(CH_2)_n$COOH (where, n is an integer of 1 to 10), —$CONH_2$, a substituted or unsubstituted $C_1$-$C_{30}$ saturated organic group, and a substituted or unsubstituted $C_1$-$C_{30}$ unsaturated organic group.

The aromatic ring-containing monomer is at least one selected from the group consisting of a monomer represented by Formula 1 and a monomer represented by Formula 2:

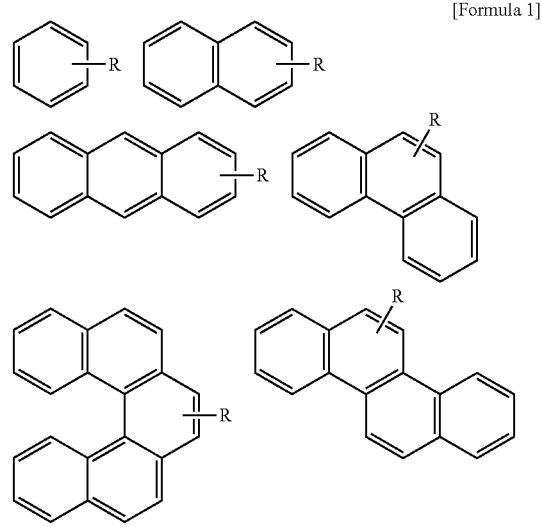

[Formula 1]

-continued

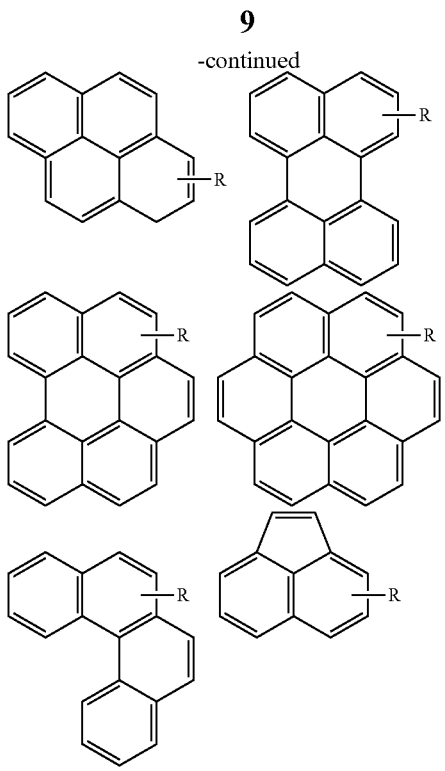

In Formula 1, R is a mono-substituted or a multi-substituted substituent that is at least one selected from the group consisting of a hydrogen atom, a halogen atom, a hydroxyl group, an isocyanate group, a glycidyloxy group, a carboxyl group, an aldehyde group, an amino group, a siloxane group, an epoxy group, an imino group, an urethane group, an ester group, an epoxy group, an amide group, an imide group, an acryl group, a methacryl group, a substituted or unsubstituted $C_1$-$C_{30}$ saturated organic group, and a substituted or unsubstituted $C_1$-$C_{30}$ unsaturated organic group.

R may be a general photosensitive functional group as well as the groups listed above.

The $C_1$-$C_{30}$ saturated organic group and the $C_1$-$C_{30}$ unsaturated organic group may have a photosensitive functional group. Here, examples of the photosensitive functional group may be an epoxy group, an amide group, an imide group, an urethane group, and an aldehyde group.

Examples of the $C_1$-$C_{30}$ saturated organic group and the $C_1$-$C_{30}$ unsaturated organic group may be a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroaryloxy group, a substituted or unsubstituted $C_4$-$C_{30}$ carbon-ring group, a substituted or unsubstituted $C_4$-$C_{30}$ carbon-ring oxy group, and a substituted or unsubstituted $C_2$-$C_{30}$ hetero-ring group.

In Formula 1, a binding site of R is not limited. Also, the number of R in Formula 1 is one for convenience of description, but R may be substituted to at any site where every substitution is possible.

A-L-A'            [Formula 2]

In Formula 2, each of A and A' are identical to or different from each other and are independently a monovalent organic group derived from one selected from the monomers represented by Formula 1; and L is a single bond including one of a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_7$-$C_{30}$ arylenealkylene group, a substituted or unsubstituted $C_6$-$C_{30}$ arylene group, a substituted or unsubstituted $C_2$-$C_{30}$ heteroarylene group, a substituted or unsubstituted $C_2$-$C_{30}$ heteroarylenealkylene group, a substituted or unsubstituted $C_1$-$C_{30}$ alkyleneoxy group, a substituted or unsubstituted $C_7$-$C_{30}$ arylenealkyleneoxy group, a substituted or unsubstituted $C_6$-$C_{30}$ aryleneoxy group, a substituted or unsubstituted $C_2$-$C_{30}$ heteroaryleneoxy group, a substituted or unsubstituted $C_2$-$C_{30}$ heteroarylenealkyleneoxy group, —C(=O)—, and —SO$^{2-}$.

In L, the substituted $C_1$-$C_{30}$ alkylene group, substituted $C_2$-$C_{30}$ alkenylene group, substituted $C_2$-$C_{30}$ alkynylene group, substituted $C_7$-$C_{30}$ arylenealkylene group, substituted $C_6$-$C_{30}$ arylene group, substituted $C_2$-$C_{30}$ heteroarylene group, substituted $C_2$-$C_{30}$ heteroarylenealkylene group, substituted $C_1$-$C_{30}$ alkyleneoxy group, substituted $C_7$-$C_{30}$ arylenealkyleneoxy group, substituted $C_6$-$C_{30}$ aryleneoxy group, substituted $C_2$-$C_{30}$ heteroaryleneoxy group, and substituted $C_2$-$C_{30}$ heteroarylenealkyleneoxy group may be substituted with at least one substituent selected from a halogen atom, a hydroxyl group, an isocyanate group, a glycidyloxy group, a carboxyl group, an aldehyde group, an amino group, a siloxane group, an epoxy group, an imino group, an urethane group, an ester group, an epoxy group, an amide group, an imide group, an acryl group, and a methacryl group, or may be substituted with a photosensitive functional group.

The first material is at least one selected from the group consisting of a compound represented by Formula 3 and a compound represented by Formula 4:

[Formula 3]

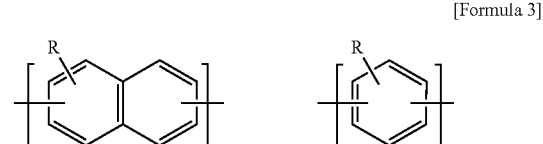

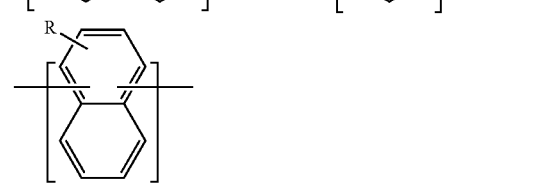

[Formula 4]

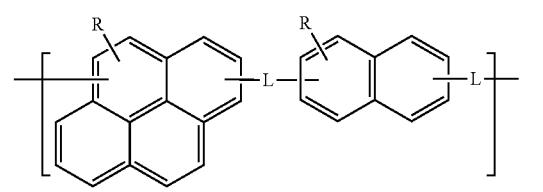

In Formula 4, R is as defined in the description of Formula 1; and L is as defined in the description of Formula 2.

In Formulae 3 and 4 above, a binding site of R is not limited, and the number of R in Formulae 3 and 4 above is one for convenience of description, but R may be substituted to at any site where every substitution is possible.

A weight average molecular weight of the polymer containing a repeating unit including an aromatic ring-containing monomer is about 300 to about 30,000. When a polymer having a weight average molecular weight within this range is used, a thin film may be more easily formed, and a transparent hardmask may be manufactured.

In example embodiments, the first material is a compound represented by Formula 5:

[Formula 5]

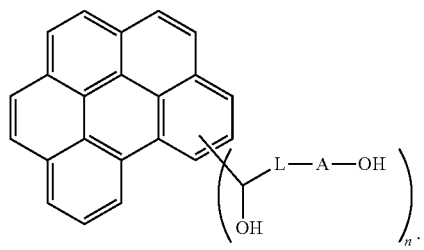

In Formula 5, A is a substituted or unsubstituted C6 to C30 arylene group; L is a single bond or a substituted or unsubstituted C1 to C6 alkylene group; and n is an integer of 1 to 5.

The arylene group is one selected from groups of Group 1:

[Group 1]

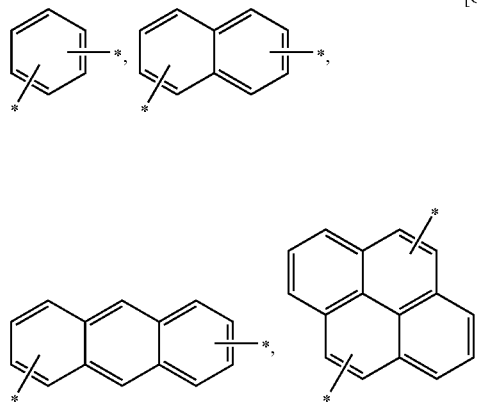

In example embodiments, the compound of Formula 5 may be represented by Formulae 6a to 6c:

[Formula 6a]

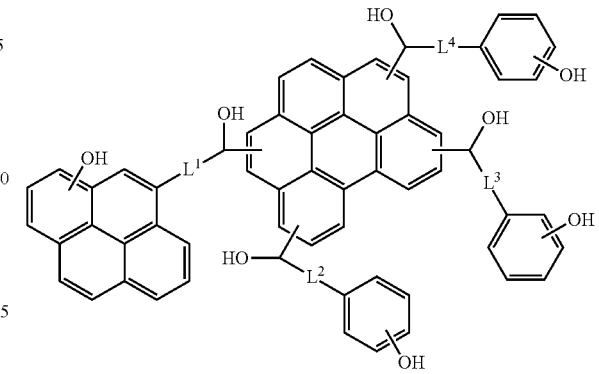

[Formula 6b]

[Formula 6c]

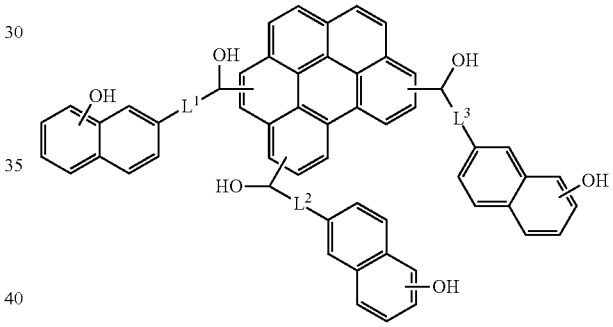

In Formula 6a, 6b, or 6c, each of $L^1$ to $L^4$ are independently one of a single bond and a substituted or unsubstituted $C_1$ to $C_6$ alkylene group.

The first material is selected from compounds represented by Formulae 6d to 6f:

[Formula 6d]

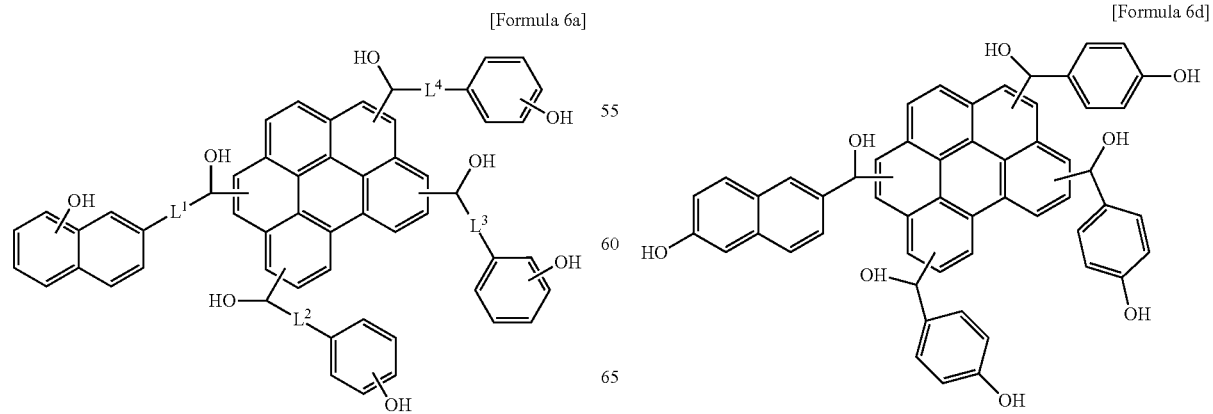

-continued

[Formula 6e]

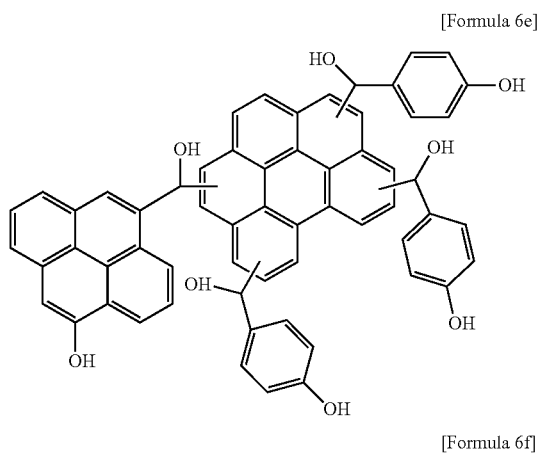

[Formula 6f]

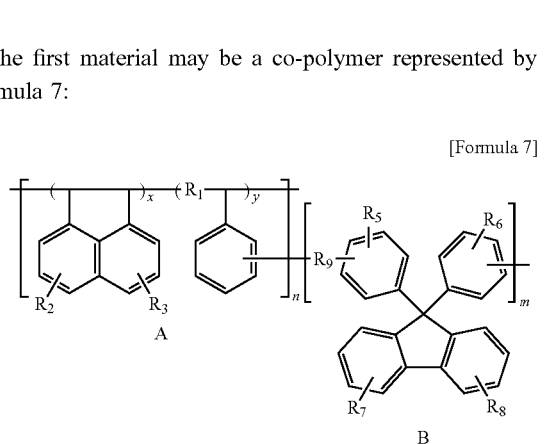

The first material may be a co-polymer represented by Formula 7:

[Formula 7]

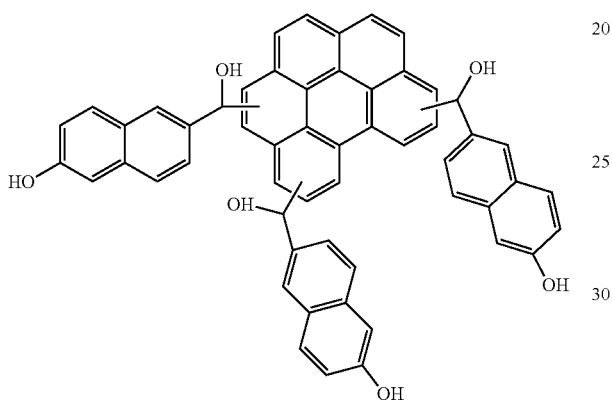

In Formula 7, $R_1$ is a $C_1$-$C_{10}$ substituted or unsubstituted alkylene group; each of $R_2$, $R_3$, $R_7$, and $R_8$ are independently one of a hydrogen atom, a hydroxyl group, a $C_1$-$C_{10}$ linear or branched cycloalkyl group, alkoxy group, $C_6$-$C_{30}$ aryl group, and a mixture thereof; each of $R_4$, $R_5$, and $R_6$ are independently one of a hydrogen atom, a hydroxyl group, a $C_1$-$C_4$ alkylether group, a $C_8$-$C_{20}$ phenyldialkylene ether group, and a mixture thereof; $R_9$ is one of a $C_1$-$C_{20}$ alkylene group, a $C_8$-$C_{20}$ phenyldialkylene group, a $C_7$-$C_{20}$ hydroxyphenylalkylene group, and a mixture thereof; each of x and y are independently a mole fraction of two repeating units in part A which is about 0 to about 1, where x+y=1; n is an integer of 1 to 200; and m is an integer of 1 to 200.

The first material is a polymer represented by Formula 7a, Formula 7b, or Formula 7c:

[Formula 7a]

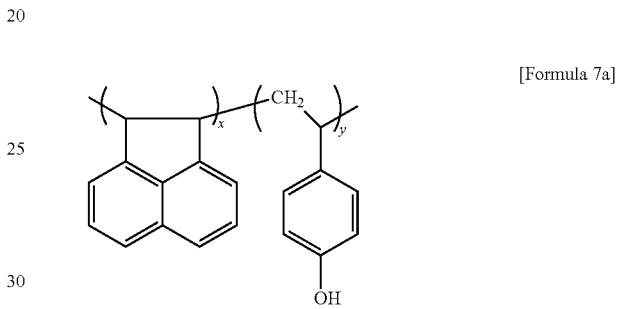

In Formula 7a, x is 0.2, and y is 0.8.

[Formula 7b]

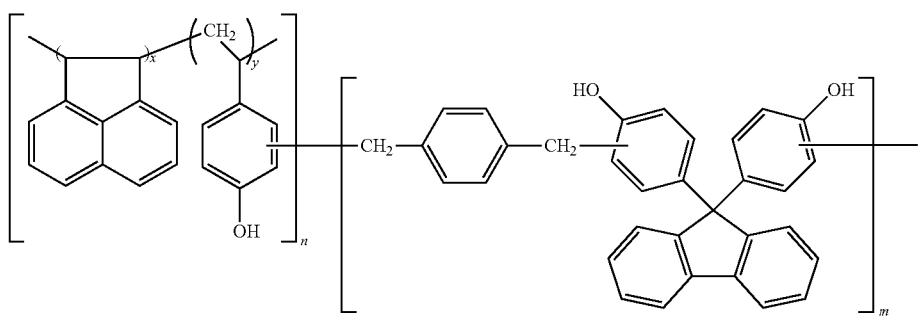

In Formula 7b, x is 0.2, y is 0.8, n=90, and m=10.

[Formula 7c]

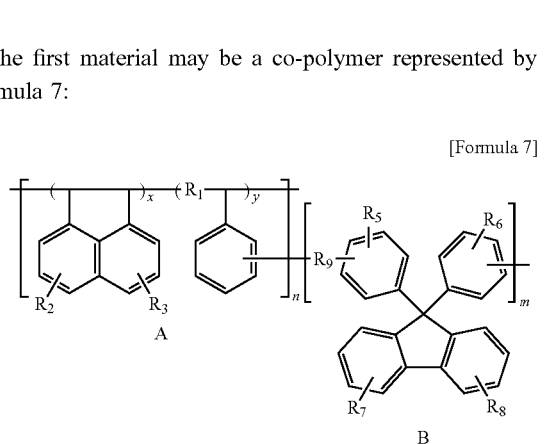

In Formula 7c, x is 0.2, y is 0.8, n=90, and m=10.

The first material may be a copolymer represented by Formula 8 or Formula 9:

[Formula 8]

[Structure: naphthalene copolymer with R1, R2, R3, R4 substituents, n and m subscripts]

[Formula 9]

[Structure: naphthalene terpolymer with R1, R2, R3, R4 substituents plus OH-naphthalene unit, n, m, l subscripts]

In Formulae 8 and 9, each of m and n are independently an integer of 1 to 190; $R_1$ is one of a hydrogen (—H), a hydroxyl group (—OH), a $C_1$-$C_{10}$ alkyl group, a $C_6$-$C_{10}$ aryl group, allyl group, and a halogen atom; $R_2$ is one of a group represented by Formula 9A, a phenyl, a chrysene, a pyrene, a fluoroanthene, an anthrone, a benzophenone, a thioxanthone, an anthracene, and their derivatives; $R_3$ is a conjugated diene; and $R_4$ is an unsaturated dienophile.

[Formula 9A]

—CH₂—   —H₂C—⌬—CH₂—

—H₂C—⌬—⌬—CH₂—

—CH—(phenyl-OH)   —CH—(phenyl)

In Formula 9A, $R_3$ is one of a 1,3-butadienyl group and a 1,6-cyclopentadienylmethyl, and $R_4$ is one of a vinyl group and a cyclopentenylmethyl group.

In example embodiments, the copolymer may be a polymer represented by one of Formulae 10 to 12:

[Formula 10]

[Structure showing copolymer with OH-naphthalene units connected by CH₂ with cyclopentadienyl-CH₂ substituents, n and m subscripts]

In Formula 10, each of m and n are independently an integer of 1 to 190, for example, m+n=21. The weight average molecular weight (Mw) of the polymer is about 10,000, and a polydispersity of the polymer is about 2.1.

[Formula 11]

[Structure showing copolymer with OH-naphthalene units connected by CH₂ with vinyl/CH=CH₂ substituents, n and m subscripts]

In Formula 11, each of m and n are independently an integer of 1 to 190, for example, m+n=21. The weight average molecular weight of the polymer is about 11,000, and a polydispersity of the polymer is about 2.1.

[Formula 12]

[Structure showing terpolymer with three OH-naphthalene units connected by CH₂, two with cyclopentadienyl-CH₂ substituents, n, m, l subscripts]

In Formula 12, each of m and n are independently an integer of 1 to 190, for example, m+n=21. The weight average molecular weight of the copolymer is about 10,000; a polydispersity of the polymer is about 1.9, l+m+n=21; and n+m:l=2:1.

[Formula 13]

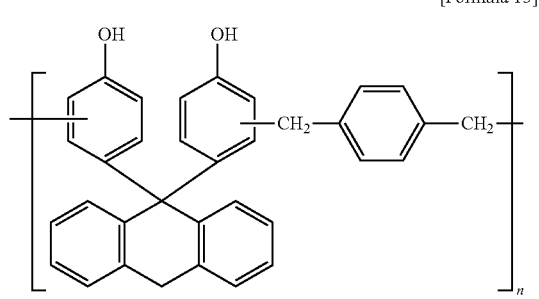

In Formula 13, the molecular average molecular weight (Mw) of the polymer is about 10,000; a polydispersity of the polymer is about 2.0, and n is an integer of 20.

The graphene nanoparticle has a relatively low reactivity with respect to a CxFy gas, which is an etching gas used to perform etching on a material layer including $SiO_2$ or SiN, and thus etching resistance of the graphene nanoparticle may increase. Also, when an etching gas, $SF_6$ or $XeF_6$, with a relatively low reactivity with respect to $SiO_2$ or SiNx is used, etching may be more easily performed on the graphene nanoparticle, and thus ashing may be more easily performed thereon as well. Moreover, the graphene nanoparticle is a material having a band gap which has a transparent property, and thus an additional align mask is not needed in the preparation process.

The hexagonal boron nitride derivative is a hexagonal boron nitride (h-BN) or a hexagonal boron carbonitride (h-BxCyNz) (where, the sum of x, y, and z is 3). In the hexagonal boron nitride derivative, boron and nitrogen atoms are regularly included in a hexagonal ring, or some of boron and nitrogen atoms are substituted with carbon atoms while maintaining a hexagonal ring.

The metal chalcogenide-based material is a compound including at least one of Group 16 (chalcogenide) elements and one or more electropositive elements. For example, the metal chalcogenide-based material includes one or more metal elements selected from molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb) and one chalcogenide element selected from sulfur (S), selenium (Se), and tellurium (Te).

The metal chalcogenide-based material is one selected from molybdenum sulfide ($MoS_2$), molybdenum selenide ($MoSe_2$), molybdenum telluride ($MoTe_2$), tungsten sulfide ($WS_2$), tungsten selenide ($WSe_2$), and tungsten telluride ($WTe_2$). In example embodiments, the metal chalcogenide-based material may be molybdenum sulfide ($MoS_2$).

The metal oxide may be, for example, at least one selected from $MoO_3$, $WO_3$, and $V_2O_5$ having a two-dimensional layered structure.

The hexagonal boron nitride has a flat hexagonal crystal structure, the vertices of which are occupied alternatively by boron and nitrogen atoms. A layered structure of the hexagonal boron nitride is a structure in which a boron atom and a nitrogen atom neighboring each other are overlapped due to their polarities, where the structure is also referred to as "an AB stacking". Here, the hexagonal boron nitride may have a layered structure, in which nanolevel-thin sheets are stacked in layers, and the layered structure may be separated or detached from each other to form a single layer or multiple layers of a hexagonal boron nitride sheet.

The hexagonal boron nitride according to example embodiments may have a peak observed at about 1360 $cm^{-1}$ in Raman spectrum analysis. This location of the peak provides information about the number of layers in the hexagonal boron nitride. Through atomic force microscopic (AFM) analysis, Raman spectrum analysis, and transmission electron microscope (TEM) analysis performed on the hexagonal boron nitride, it may be known that the hexagonal boron nitride has a nanosheet structure.

X-ray diffraction analysis using CuKα is performed on the hexagonal boron nitride, and as the result of the X-ray analysis, the hexagonal boron nitride may include a two-dimensional layered structure having a (002) crystal face. A peak of the (002) crystal face peak is observed within a range of about 20° to about 27°.

An interlayer distance (d-spacing) of the two-dimensional carbon nanostructure obtained from the X-ray diffraction analysis is in a range of about 0.3 nm to about 0.7 nm, for example, about 0.334 nm to about 0.478 nm. In addition, an average particle diameter of the hexagonal boron nitride crystals obtained from the X-ray diffraction analysis is about 1 nm or greater, or for example, in a range of about 23.7 Å to about 43.9 Å. When the interlayer distance is within this range, the hardmask composition may have desirable etching resistance.

The hexagonal boron nitride is formed as a single layer of a two-dimensional boron nitride or multiple layers of a two-dimensional boron nitride.

Hereinafter, a method of preparing a hardmask using the hardmask composition according to example embodiments will be described in detail.

The hardmask composition according to example embodiments includes a graphene nanoparticle and a solvent.

The hardmask composition has desirable stability.

During or after the process of coating the etching layer with the hardmask composition, a heat-treating process may be performed. Conditions for the heat-treating process may vary depending on a material of the etching layer, but a temperature of the heat-treating process may be from room temperature (about 20° C. to 25° C.) to about 1500° C.

The heat-treating process is performed in an inert gas atmosphere or in vacuum.

A heating source of the heat-treating process may be induction heating, radiant heat, lasers, infrared rays, microwaves, plasma, ultraviolet rays, or surface plasmon heating.

The inert gas atmosphere may be prepared by mixing a nitrogen gas and/or an argon gas.

After the heat-treating process, the solvent may be removed. The resultant from which the solvent is removed may be baked at a temperature of about 400° C. or lower, for example, about 100° C. to about 400° C., and then another heat-treating process may be performed on the baked resultant at a temperature of about 800° C. or lower, or, for example, in a range of about 400° C. to about 800° C.

A thermal reduction process may proceed during the heat-treating process. When the graphene nanoparticle undergoes the thermal reduction process, an oxygen content of the graphene nanoparticle may decrease.

In example embodiments, the method does not include the baking process described above and may only include the heat-treating process.

When the temperatures of the heat-treating process and the baking process are within these ranges above, the hardmasks with desirable etching resistance may be prepared.

A temperature increasing rate in the heat-treating process and the baking process is about 1° C./min to about 1000° C./min. When a temperature increasing rate is within this range, the deposited layer may not be damaged due to a rapid temperature change, and thus a process efficiency may be desirable.

A thickness of the hardmask may be in a range of about 10 nm to about 10,000 nm.

Hereinafter, a method of preparing a graphene nanoparticle will be described in detail.

According to the first preparation method, an interlayer insertion material may be intercalated into graphite to prepare a graphite intercalation compound (GIC), and a graphene nanoparticle may be obtained therefrom.

The interlayer insertion material may be, for example, potassium sodium tartrate. When potassium sodium tartrate is used as the interlayer insertion material, the material intercalates into graphite without an additional surfactant or a solvent during a solvo-thermal reaction to prepare the GIC, and then the desired graphene nanoparticle may be obtained via a process of selecting a particle size of the resultant. Potassium sodium tartrate may simultaneously serve as an interlayer insertion material and a solvent.

The solvo-thermal reaction may be performed in, for example, an autoclave. The solvo-thermal reaction may be performed at a temperature, for example, in a range of about 25° C. to about 400° C., or, for example, at about 250° C.

Examples of graphite, as a starting material, may include natural graphite, kish graphite, synthetic graphite, expandable graphite or expanded graphite, or a mixture thereof.

The third preparation method is a method of preparing a graphene nanoparticle to which a functional group is attached. The functional group may be, for example, a hydroxyl group. A hydroxyl group-attached graphene nanoparticle is highly soluble in a solvent and thus may be utilized in various applications.

A hydroxyl group-attached graphene nanoparticle according to example embodiments may be prepared as follows.

A hydrothermal fusion reaction is performed on a polycyclic aromatic hydrocarbon under an alkali aqueous solution condition, and thus a graphene nanoparticle having a single crystal may be obtained.

A hydrothermal reaction under the alkali aqueous solution condition may be performed at a temperature in a range of about 90° C. to about 200° C. In the hydrothermal reaction, when alkaline species, e.g., OH—, are present, hydrogen removal, condensation, or graphitization, and edge functionalization may occur.

Examples of the polycyclic aromatic hydrocarbon may include a pyrene and a 1-nitropyrene.

Before performing the hydrothermal reaction, a nitration reaction may be performed on the polycyclic aromatic hydrocarbon. The nitration reaction may be performed using a hot nitrate (hot $HNO_3$).

During the hydrothermal reaction, an amine-based material, e.g., $NH_3$ or $NH_2NH_2$, may be added. When such an amine-based material is added, water-soluble OH— and an amine-functionalized graphene nanoparticle may be obtained.

According to the second preparation method, a graphene nanoparticle may be obtained by acid-treating graphite. For example, an acid and an oxidizing agent are added to graphite, heated and allowed to react, and cooled to room temperature (25° C.) to obtain a graphene nanoparticle precursor-containing mixture. An oxidizing agent may be added to the precursor containing mixture to undergo an oxidizing process, and the resultant may be worked up to prepare the desired graphene nanoparticle.

Examples of the acid may include sulfuric acid, nitric acid, acetic acid, phosphoric acid, hydrofluoric acid, perchloric acid, trifluoroacetic acid, hydrochloric acid, m-chlorobenzoic acid, and a mixture thereof. Also, examples of the oxidizing agent may include, potassium permanganate, potassium perchlorate, ammonium persulfate, and a mixture thereof. Examples of the acid and the oxidizing agent are as described above. An amount of the oxidizing agent may be in a range of about 0.00001 part to about 30 parts by weight based on 100 parts by weight of graphite.

The reaction proceeds by adding the acid and the oxidizing agent to graphite and heating the resultant using, for example, a microwave. The microwave may have an output in a range of about 50 W to about 1500 W and a frequency in a range of about 2.45 GHz to about 60 GHz. A period of time for applying the microwave may vary depending on the frequency of the microwave, but the microwave may be applied for about 10 minutes to about 30 minutes.

The work-up process includes controlling the resultant underwent the oxidizing process to room temperature, adding deionized water to dilute the resultant, and adding a base thereto to perform neutralization of the resultant.

Also, the work-up process may include a process of selecting a particle size from the resultant to obtain the desired graphene nanoparticle.

Hereinafter, in example embodiments, a method of forming a pattern using a hardmask composition will be described by referring to FIGS. 1A to 1E.

Referring to FIG. 1A, an etching layer 11 is formed on a substrate 10. A hardmask composition including graphene nanoparticles and a solvent are provided on the etching layer 11 to form a hardmask 12, wherein the graphene nanoparticles contains about 0.01 atom % to about 40 atom % of oxygen.

A process of providing the hardmask composition is performed by one method selected from spin coating, air spraying, electrospraying, dip coating, spray coating, doctor blade coating, and bar coating.

In example embodiments, the hardmask composition may be provided using a spin-on coating method. Here, the hardmask composition may coat the substrate 10 at a thickness of, for example, in a range of about 10 nm to about 10,000 nm, or, about 10 nm to about 1,000 nm, but the thickness of the hard composition is not limited thereto.

A substrate 10 is not particularly limited, and the substrate may be at least one selected from, for example, a Si substrate; a glass substrate; a GaN substrate; a silica substrate; a substrate including at least one selected from nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate.

A photoresist layer 13 is formed on the hardmask 12.

Figure 1B:
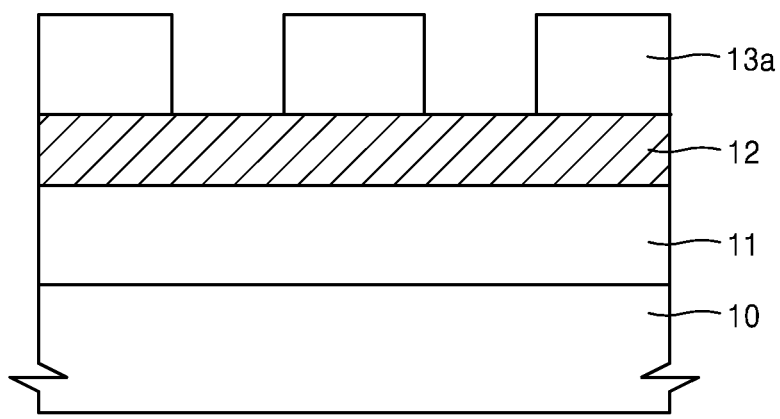

As shown in FIG. 1B, a photoresist pattern 13a is formed by exposing and developing the photoresist layer 13 using a common method in the art.

The process of exposing the photoresist layer 13 may be performed using, for example, ArF, KrF, or EUV. Also, after the exposing process, a heat-treating process at a temperature in a range of about 200° C. to about 500° C. may be performed on the exposed photoresist layer 13.

In the developing process, a developing solution, e.g., an aqueous solution of tetramethylammonium hydroxide (TMAH), may be used.

Figure 1C:
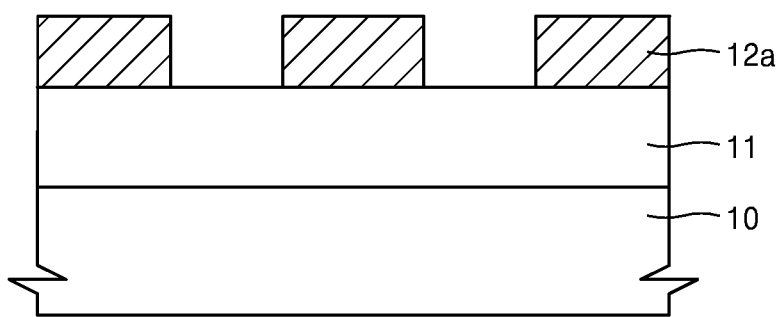

Thereafter, the hardmask 12 may be etched using the photoresist pattern 13a as an etching mask to form a hardmask pattern 12a on the etching layer 11 (FIG. 1C).

A thickness of the hardmask pattern 12a may be in a range of about 10 nm to about 10,000 nm. When the thickness of the hardmask pattern 12a is within this range, the layer may have desirable etching resistance as well as desirable homogeneousness.

For example, the etching process may be performed using a dry etching method using an etching gas. Examples of the etching gas include at least one selected from $CF_4$, $CHF_3$, $Cl_2$, and $BCl_3$.

In example embodiments, when a mixture gas of $C_4F_8$ and $CHF_3$ is used as the etching gas, a mixing ratio of $C_4F_8$ and $CHF_3$ may be in a range of about 1:10 to about 10:1 at a volume ratio.

The etching layer 11 may be formed as a plurality of patterns. The plurality of patterns may vary, for example, a metal pattern, a semiconductor pattern, and an insulator pattern. For example, the plurality of patterns may be various patterns applied to a semiconductor integrated circuit device.

The etching layer 11 may contain a material that is to be finally patterned. The material of the etching layer 11 may be, for example, a metal (e.g., aluminum or copper), a semiconductor (e.g., silicon), or an insulator (e.g., silicon oxide or silicon nitride). The etching layer 11 may be formed using various methods (e.g., sputtering, electronic beam deposition, chemical vapor deposition, and physical vapor deposition). For example, the etching layer 11 may be formed using a chemical vapor deposition method.

Figure 1D:
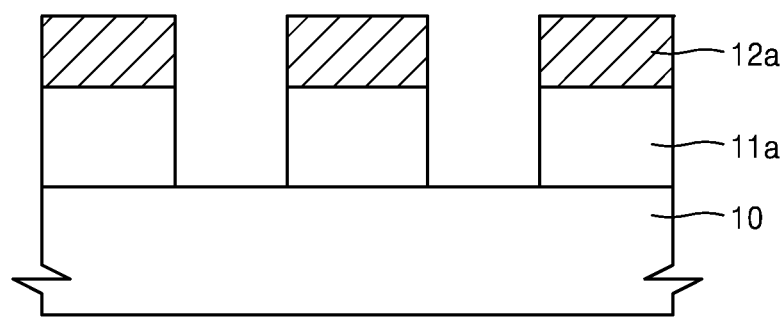
Figure 1E:
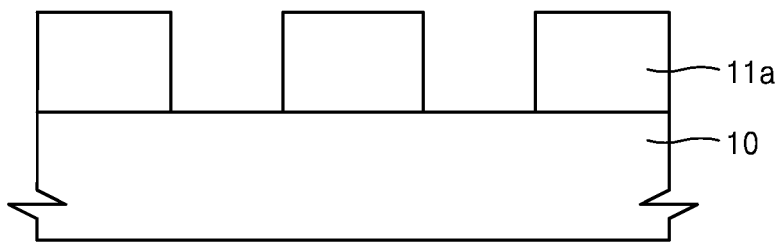

As shown in FIGS. 1D to 1E, the etching layer 11 may be etched using the hardmask pattern 12a as an etching mask to later form an etching layer pattern 11a having a desired fine pattern.

The hardmask according to example embodiments may be used as a stopper in the manufacture of a semiconductor device by being inserted between other layers.

Hereinafter, in example embodiments, a method of forming a pattern using a hardmask composition will be described by referring to FIGS. 2A to 2D.

Figure 2A:
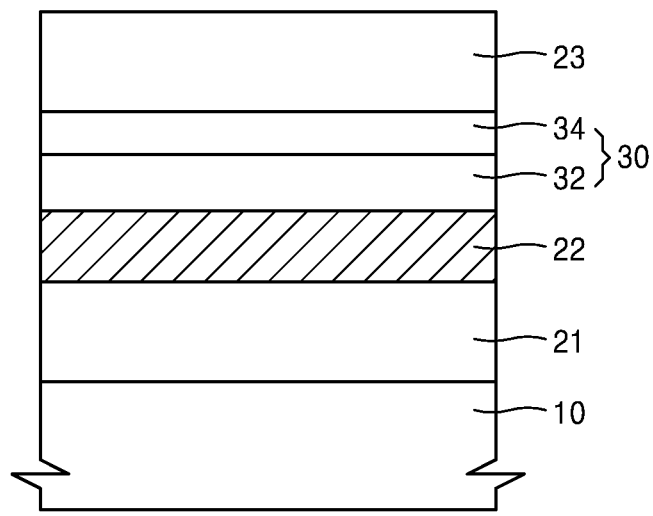
FIGS. 2A to 2D illustrate a method of forming a pattern using a hardmask composition according to example embodiments.

Referring to FIG. 2A, an etching layer 21 is formed on a substrate 20. The substrate 20 may be a silicon substrate.

The etching layer 21 may be formed as, for example, a silicon oxide layer, a silicon nitride layer, a silicon nitroxide layer, a silicon carbide (SiC) layer, or a derivative layer thereof.

Thereafter, a hardmask composition may be provided on the etching layer 21 to form a hardmask 22.

Figure 2B:
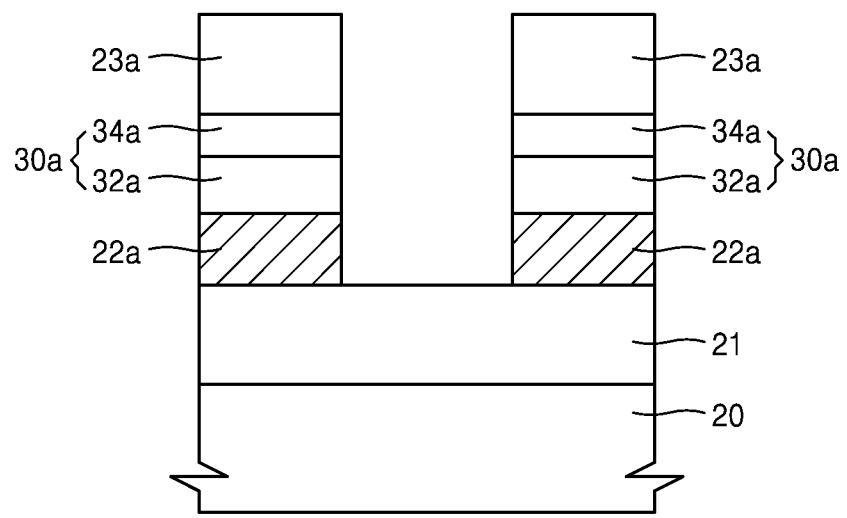
Figure 2C:
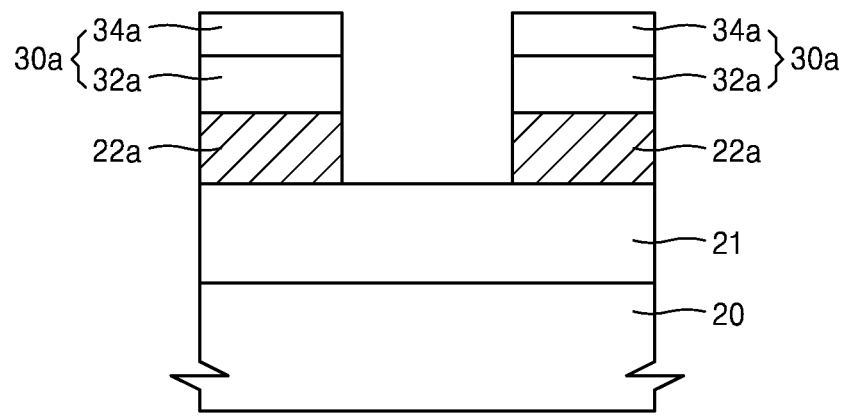

An anti-reflection layer 30 is formed on the hardmask 22. Here, the anti-reflection layer 30 may include an inorganic anti-reflection layer, an organic anti-reflection layer, or a combination thereof. FIGS. 2A to 2C illustrate cases where the anti-reflection layer 30 includes an inorganic anti-reflection layer 32 and an organic anti-reflection layer 34.

The inorganic anti-reflection layer 32 may be, for example, a SiON layer, and the organic anti-reflection layer 34 may be a polymer layer commonly used in the art having an appropriate refraction index and a relatively high absorption coefficient on a photoresist with respect to a wavelength of light.

A thickness of the anti-reflection layer 30 may be, for example, in a range of about 100 nm to about 500 nm.

A photoresist layer 23 is formed on the anti-reflection layer 30.

The photoresist layer 23 is exposed and developed in a common manner to form a photoresist pattern 23a. Then, the anti-reflection layer 30 and the hardmask 22 are sequentially etched using the photoresist pattern 23a as an etching mask to form a hardmask pattern 22a on the etching layer 21. The hardmask pattern 22a includes an inorganic reflection prevention pattern 32a and an organic reflection prevention pattern 34a.

FIG. 2B illustrates that the photoresist pattern 23a and a reflection prevention pattern 30a remain after forming the hardmask pattern 22a. However, in some cases, part of or the whole photoresist pattern 23a and the reflection prevention pattern 30a may be removed during the etching process for forming the hardmask pattern 22a.

FIG. 2C illustrates that only the photoresist pattern 23a is removed.

Figure 2D:
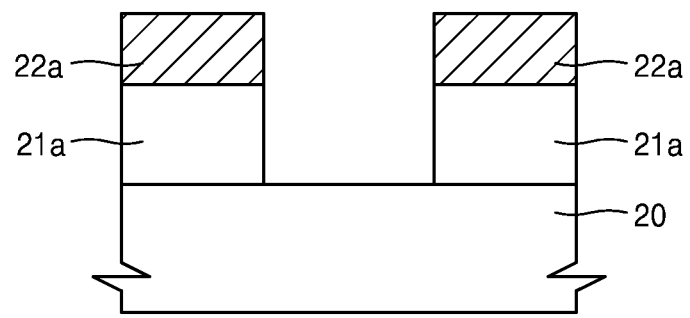

The etching layer 21 is etched using the hardmask pattern 22a as an etching mask to form a desired layer pattern, which is an etching layer pattern 21a (FIG. 2D).

As described above, the hardmask pattern 22a is removed after forming the etching layer pattern 21. In the preparation of the hardmask pattern according to example embodiments, the hardmask pattern 22a may be more easily removed using a common method in the art, and almost no residue remains after removing the hardmask pattern 22a.

The removing process of the hardmask pattern 22a may be performed by, but not limited to, $O_2$ ashing and wet stripping. For example, the wet stripping may be performed using alcohol, acetone, or a mixture of nitric acid and sulfuric acid.

The hardmask includes a graphene nanoparticle may have an amount of $sp^2$ carbon structures that is higher than the amount of $sp^3$ carbon structures, and thus the hardmask may secure sufficient resistance to dry etching. Also, when the hardmask composition according to example embodiments is used, a transparent property of a thin layer may be desirable, and thus an align mask for patterning may be more easily sensed.

According to example embodiments, a pattern formed using a hardmask composition may be used in the manufacture and design of an integrated circuit device according to a preparation process of a semiconductor device. For example, the pattern may be used in the formation of a patterned material layer structure, e.g., metal lining, holes for contact or bias, insulation sections (for example: a Damascene Trench (DT) or shallow trench isolation (STI)), or a trench for a capacitor structure.

Thereinafter, example embodiments will be described in detail with reference to the following examples. However, these examples are not intended to limit the scope of the example embodiments.

Preparation Example 1: Preparation of Graphene Nanoparticle 20 mg of graphite (available from Aldrich) and 100 mg of potassium sodium tartrate were added to an autoclave vessel, and the mixture was allowed to react at a temperature of 250° C. for about 60 minutes.

When the reaction was completed, the resultant was centrifuged using a filter (8,000 and 10,000 NMWL, available from Amicon Ultra-15) to select a particle size, and this underwent dialysis to remove residues. Then the resultant was dried to obtain a spherical graphene nanoparticle having a particle diameter of about 10 nm.

Preparation Example 2: Preparation of Graphene Nanoparticle 20 mg of graphite (available from Alfa Aesar) was dissolved in 100 ml of a concentrated sulfuric acid, and the mixture was sonicated for about 1 hour. 1 g of KMnO4 was added thereto, and a temperature of the reaction mixture was controlled to be about 25° C. or lower.

At room temperature, the resultant was refluxed for 10 minutes by applying a microwave (power: about 600 W) thereto. The reaction mixture was cooled so that a temperature of the reaction mixture was about 25° C., and then 700 ml of deionized water was added to the reaction mixture to dilute the reaction mixture. Next, a sodium hydroxide was added to the reaction mixture in an ice bath so that pH of the reaction mixture was controlled to about 7.

The reaction mixture was filtered through a porous membrane having a pore diameter of about 200 nm to separate and remove graphene having a large size. Residues in the filtrate thus obtained was removed by performing dialysis, and the resultant was dried to obtain a spherical graphene nanoparticle having an average particle diameter of about 50 nm.

Preparation Example 3: Preparation of Graphene Nanoparticle to which Hydroxyl Group (OH) is Bonded 160 ml of nitric acid was added to 2 g of pyrene, and the mixture was refluxed at a temperature of about 80° C. for about 12 hours to obtain a reaction mixture containing 1,3,6-trinitropyrene. The reaction mixture was cooled to room temperature, and 1 L of deionized water and water were added thereto to dilute the reaction mixture, and this was filtered through a fine porous film having a pore diameter of about 0.22 μm.

1.0 g of 1,3,6-trinitropyrene obtained after the filtration was dispersed in 0.6 L of 0.2 M NaOH aqueous solution, and ultrasonic waves (500 W, 40 kHz) was then applied thereto for about 2 hours to obtain a suspension. The suspension thus obtained was placed in an autoclave vessel and was allowed to react at a temperature of about 200° C. for about 10 hours. The resultant was cooled to room temperature and filtered through a fine porous film having a pore diameter of about 0.22 μm to remove an insoluble carbon product. Dialysis was performed on the resultant thus obtained after the filtration for 2 hours to obtain a graphene nanoparticle having an average particle diameter of about 15 nm, and an OH group is bonded to the graphene nanoparticle.

The graphene particles prepared in Preparation Examples 1 and 3 have a structure including an oxygen-containing functional group at an edge of the graphene particles. Also, the graphene nanoparticle prepared in Preparation Example 2 has a structure including an oxygen-containing functional group at an edge and in a plane of the graphene using a microwave during the preparation process.

Example 1

0.5 g of the graphene nanoparticle prepared in Preparation Example 1 was dispersed in 0.1 L of water to prepare a hardmask composition. While spray-coating a silicon substrate, on which a silicon oxide was formed, with the hardmask composition, the substrate was heat-treated at a temperature of 200° C. Subsequently, the resultant was baked at a temperature of 400° C. for 1 hour, and thus a hardmask having a thickness of about 100 nm and containing a graphene nanoparticle was prepared.

The hardmask was coated with an ArF photoresist at a thickness of about 1700 Å and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % tetramethyl ammonium hydroxide (TMAH) to form a photoresist pattern.

Dry etching was performed using the photoresist pattern, as a mask, and a $CF_4/CHF_3$ mixture gas. The etching conditions included 20 mT of a chamber pressure, 1800 W of a RT power, a 4/10 volume ratio of $C_4F_8/CHF_3$, and an etching time of about 120 seconds.

$O_2$ ashing and wet stripping were performed on a post hardmask and an organic material remaining after performing the dry etching to obtain a desired silicon substrate having a silicon oxide layer pattern as a final pattern.

Example 2

A silicon substrate having a silicon oxide layer pattern was prepared in the same manner as in Example 1, except that the graphene nanoparticle prepared in Example 2 was used instead of the graphene nanoparticle prepared in Example 1, and a vacuum heat-treatment process at about 600° C. was further performed on the substrate after baking at about 400° C.

Example 3

A silicon substrate having a silicon oxide layer pattern was prepared in the same manner as in Example 1, except that a vacuum heat-treatment process at about 600° C. was further performed on the substrate after baking at about 400° C.

Example 4

A silicon substrate having a silicon oxide layer pattern was prepared in the same manner as in Example 1, except that a vacuum heat-treatment temperature was changed to about 900° C.

Example 5

A silicon substrate having a silicon oxide layer pattern was prepared in the same manner as in Example 1, except that the graphene nanoparticle prepared in Preparation Example 2 was used instead of the graphene nanoparticle prepared in Preparation Example 1.

Example 6

A silicon substrate having a silicon oxide layer pattern was prepared in the same manner as in Example 1, except that the graphene nanoparticle prepared in Preparation Example 3 was used instead of the graphene nanoparticle prepared in Preparation Example 1.

Comparative Example 1

A silicon substrate having a silicon oxide layer pattern was prepared using a hardmask including high-temperature amorphous carbon.

A carbon source ($C_3H_6$) was vapor-deposited on the silicon oxide layer formed on the silicon substrate to form a hardmask including high-temperature amorphous carbon.

The vapor deposition was performed using a chemical vapor deposition method under conditions including a temperature of about 550° C., a pressure in a range of about 0.01 mTorr to about 1 mTorr, and an ion energy in a range of about 50 eV to about 500 eV.

The hardmask was coated with an ArF photoresist at a thickness of about 1700 Å and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % TMAH to form a photoresist pattern.

Dry etching was performed using the photoresist pattern, as a mask, and a $CF_4/CHF_3$ mixture gas. The etching conditions included 20 mT of a chamber pressure, 1800 W of a RT power, a 4/10 volume ratio of $C_4F_8/CHF_3$, and an etching time of about 120 seconds.

O2 ashing and wet stripping were performed on the hardmask and an organic material remaining after performing the dry etching to obtain a desired silicon substrate having a silicon oxide layer pattern as a final pattern.

Comparative Example 2

A silicon substrate having a silicon oxide layer pattern was prepared using a hardmask including low-temperature amorphous carbon in the same manner as in Comparative Example 1, except that a temperature of a deposition condition for the carbon source ($C_3H_6$) was changed to 300° C. to obtain low-temperature amorphous carbon.

Comparative Example 3

A monomer represented by Formula 6d was dissolved in a mixture solvent of propylene glycol monomethyl ether acetate (PGMEA), methylpyrrolidone, and gamma-butyrolactone (at a volume mixing ratio of 40:20:40), and the solution was filtered to prepare a hardmask composition.

[Formula 1]

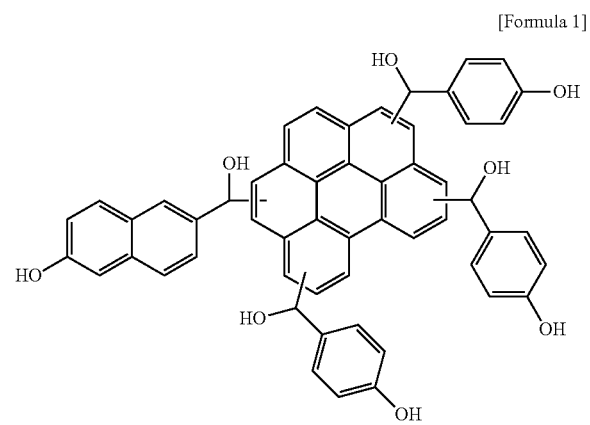

A silicon substrate having a silicon oxide layer pattern was coated with the hardmask composition obtained in the manner described above using a spin-on coating method, and then the resultant was heat-treated at a temperature of about 400° C. for about 120 seconds to form a hardmask including spin-on-carbon (SOC).

The hardmask was coated with an ArF photoresist at a thickness of about 1700 Å and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % TMAH to form a photoresist pattern.

Dry etching was performed using the photoresist pattern as a mask and a $CF_4/CHF_3$ mixture gas. The etching conditions included 20 mT of a chamber pressure, 1800 W of a RF power, a 4/10 volume ratio of $C_4F_8/CHF_3$, and an etching time of about 120 seconds.

O2 ashing and wet stripping were performed on the hardmask and an organic material remaining after performing the dry etching to obtain a desired silicon substrate having a silicon oxide layer pattern as a final pattern.

Reference Example 1

10 g of a graphite powder was added to 50 ml of sulfuric acid (H2SO4), and the mixture was stirred at a temperature of 80° C. for about 4 hours to about 5 hours. The stirred mixture was diluted with 1 L of deionized water and stirred for about 12 hours. Then, the resultant was filtered to obtain pre-treated graphite.

Phosphorus pentoxide was dissolved in 80 ml of water, 480 ml of sulfuric acid was added thereto, and 4 g of the pre-treated graphite was added thereto, and 24 g of potassium permanganate (KMnO4) was added thereto. The mixture was stirred and sonicated for about 1 hour, and 600 ml of water (H2O) was added thereto. When 15 ml of hydrogen peroxide (H2O2) was added to the reaction mixture, color of the reaction mixture changed from purple to light yellow, and the mixture was sonicated while being stirred. The reaction mixture was filtered to remove non-oxidized remaining graphite. In order to remove manganese (Mn) from the filtrate, 200 ml of HCl, 200 ml of ethanol, and 200 ml of water was added to the filtrate, and the mixture was stirred. The mixture was centrifuged to obtain a 2-dimensional carbon nanostructure precursor.

0.5 g of the 2-dimensional carbon nanostructure precursor thus obtained was dispersed in 1 L of water to obtain a hardmask composition. While spray-coating a silicon substrate, on which a silicon oxide was formed, with the hardmask composition, the substrate was heat-treated at a temperature of 200° C. Subsequently, the resultant was baked at a temperature of 400° C. for 1 hour, and vacuum heat-treated at a temperature of 600° C. for 1 hour to prepare a hardmask having a thickness of about 200 nm and containing a graphene nanoparticle.

Evaluation Example 1: Transmittance

Transmittances of the hardmasks prepared in Examples 1 to 6, Comparative Examples 1 to 3, and Reference Example 1 were measured by light exposure at a wavelength of about 633 nm.

As the result, it was confirmed that transmittances of the hardmask patterns prepared in Examples 1 to 6 were improved about 1% or less compared to transmittances of the hardmask patterns prepared in Comparative Examples 1 to 3 and Reference Example 1. In this regard, when a hardmask with improved transmittance is used, a hardmask pattern and an align mark for patterning an etching layer may be more easily sensed, and thus an etching layer may be patterned to have a fine and compact sized pattern.

Evaluation Example 2: Etching Resistance

Etching resistance was evaluated by measuring a thickness difference between before and after performing dry etching on the hardmasks and the silicon oxide layers using the hardmasks prepared in Examples 1 to 6 and Comparative Examples 1 to 3 and calculating an etching selection ratio according to Equation 1 below.

Etching selection ratio=(A thickness of the silicon oxide before performing etching on a silicon oxide−a thickness of the silicon oxide after performing etching on a silicon oxide)/(a thickness of the hardmask before performing etching on a hardmask−a thickness of the hardmask after performing etching on a hardmask)×100    [Equation 1]

As shown in Equation 1, the etching selection ratio shows a ratio of the thickness difference of the silicon oxide before and after the etching to the thickness difference of the hard mask before and after the etching.

As the result, it may be known that the etching selection ratios in the cases of Examples 1 to 6 increased and thus have desirable etching resistance compared to those of Comparative Examples 1 to 3.

As described above, according to example embodiments, a hardmask including a hardmask composition may have desirable stability and improved etching resistance and mechanical strength compared to those of a polymer or an amorphous carbon generally used, and the hardmask may be more easily removed after an etching process. When the hardmask is used, a pattern may be finely and evenly formed, and efficiency of a semiconductor process may be improved compared to when the hardmask is not used.

It should be understood that example embodiments described herein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A method of forming a pattern, the method comprising:
   forming as etching layer on a substrate;
   forming a hardmask layer including graphene nanoparticles by providing a hardmask composition on the etching layer, the hardmask composition including,
   a plurality of graphene nanoparticles having a size in a range of about 5 am to about 100 nm, and
   a solvent;
   forming a photoresist layer on the hardmask layer;
   forming, a hardmask including the plurality of graphene nanoparticles by patterning the hard mask layer, the patterning including etching the plurality of graphene nanoparticles using the photoresist layer as an etching mask; and
   etching the etching layer using the hardmask as an etching mask.

2. The method of claim 1, wherein the forming a hardmask layer forms the hardmask layer by coating the hardmask composition on the etching layer, further comprising:
   performing a heat-treatment on the hardmask composition during or after the coating.

3. The method of claim 1, wherein a thickness of the hardmask is in a range of about 10 nm to about 10,000 nm.

4. The method of claim 1, wherein the forming a hardmask layer forms the hardmask layer using at least one of spin coating, air-spray, electrospray, dip coating, spray coating, a doctor blade method, and bar coating.

5. The method of claim 1, wherein the forming a hardmask forms the hardmask having a transmittance of 1% or lower at a light wavelength of about 633 nm.

* * * * *